US010652977B2

(12) United States Patent
Oh

(10) Patent No.: US 10,652,977 B2
(45) Date of Patent: May 12, 2020

(54) RANDOM LIGHTING DEVICE

(71) Applicant: OPENIOT CO., LTD., Anyang-si (KR)

(72) Inventor: Keon Oh, Gwacheon-si (KR)

(73) Assignee: OPENIOT CO., LTD., Anyang-si (KR)

( * ) Notice: Subject to any disclaimer, the term of this patent is extended or adjusted under 35 U.S.C. 154(b) by 0 days.

(21) Appl. No.: 16/463,527

(22) PCT Filed: Nov. 23, 2017

(86) PCT No.: PCT/KR2017/013425
§ 371 (c)(1),
(2) Date: May 23, 2019

(87) PCT Pub. No.: WO2018/101675
PCT Pub. Date: Jun. 7, 2018

(65) Prior Publication Data
US 2019/0380184 A1 Dec. 12, 2019

(30) Foreign Application Priority Data

Nov. 30, 2016 (KR) ........................ 10-2016-0161852

(51) Int. Cl.
*H03K 7/08* (2006.01)
*H05B 33/08* (2020.01)
*H05B 45/10* (2020.01)

(52) U.S. Cl.
CPC ............... *H05B 45/10* (2020.01); *H03K 7/08* (2013.01)

(58) Field of Classification Search
None
See application file for complete search history.

(56) References Cited

FOREIGN PATENT DOCUMENTS

| CN | 203286484 U | * 11/2013 |
|---|---|---|
| JP | 2001-351788 A | 12/2001 |
| JP | 2004-311143 A | 11/2004 |
| JP | 2014-160553 A | 9/2014 |
| KR | 10-2006-0012460 A | 2/2006 |
| KR | 10-2011-0054961 A | 5/2011 |

* cited by examiner

*Primary Examiner* — Dedei K Hammond
(74) *Attorney, Agent, or Firm* — KORUS Patent, LLC; Seong Il Jeong

(57) ABSTRACT

A random lighting device is disclosed. The random lighting device includes: a plurality of light-emitting units, each including a light emitting diode and a light-emitting control unit for randomly determining a flickering cycle and brightness of the light emitting diode to control the light emission of the light emitting diode; and a control unit for limiting a range of the flickering cycle and brightness of the light-emitting units.

9 Claims, 3 Drawing Sheets

| variable | | unit | byte | range | |
|---|---|---|---|---|---|
| | | | | lowest value (msec) | highest value (msec) |
| flickering cycle | lighting-out time | msec | 2 | 0 ~ 65,365 | Min. ~ 65,365 |
| | lighting-on time | msec | 2 | 0 ~ 65,365 | Min. ~ 65,365 |
| brightness | | (D/2.55)% | 1 | 0 ~ 255 | 0 ~ 255 |
| dimming | rising time | msec | 2 | 0 ~ 65,365 | Min. ~ 65,365 |
| | falling time | msec | 2 | 0 ~ 65,365 | Min. ~ 65,365 |

RANDOM LIGHTING DEVICE

TECHNICAL FIELD

The present relates to a lighting device and, more particularly, to a lighting device using a light emitting diode.

Background Art

Korean Patent Application Publication No. 10-2006-0012460 discloses lighting equipment for interior design. The lighting equipment according to this publication intensively illuminates display items, such as picture frames, pots, fish tanks, and ceramics displayed in a display room to improve the indoor atmosphere, operates the lighting lamp only for the time set by allowing a user to operate the time switch to avoid unnecessary power consumption, and performs crime prevention by enabling automatic flickering at night when the user leave his/her home for a long time. In addition, the lighting equipment further improves the indoor atmosphere by disposing LEDs of various colors around the lighting lamp and controlling them to turn on sequentially or randomly.

DOCUMENTS OF RELATED ART

Patent Document

Korean Patent Application Publication No. 10-2006-0012460 (published on Feb. 8, 2006)

DISCLOSURE

Technical Problem

It is an object of the present invention to provide a random lighting device that allows light emitting diodes to randomly emit light by themselves while also permitting various atmospheres to be created.

Technical Solution

A random lighting device according to an aspect of the present invention includes a plurality of light-emitting units and a control unit. The light emitting units may include a light emitting diode and a light-emitting control unit for randomly determining a flickering cycle and brightness of the light emitting diode to control light emission of the light emitting diode. The control unit may limit ranges of the flickering cycle and brightness of the light-emitting units.

The light-emitting control unit may further include a variable storage storing a flickering cycle range variable and a brightness range variable for limiting the flickering cycle and the brightness received from the control unit, respectively; a light emission random determiner randomly determining the flickering cycle and the brightness within a flickering cycle range and a brightness range limited according to the flickering cycle range variable and the brightness range variable stored in the variable storage; a pulse width modulation generator generating a pulse width modulation signal according to the randomly determined brightness; and a light emitting diode driver driving the light emitting diode with the pulse width modulation signal according to a lighting-on interval of the randomly determined flickering cycle.

In addition, the light-emitting control unit may further include a variable storage storing a flickering cycle range variable and a brightness range variable for limiting the flickering cycle and the brightness received from the control unit, respectively, and a dimming range variable for limiting dimming; a light emission random determiner randomly determining the flickering cycle within a flickering cycle range limited according to the flickering cycle range variable stored in the variable storage and randomly determining the brightness within a brightness range limited according to the brightness range variable stored in the variable storage, and randomly determining a rising time and a falling time within a rising time range and a falling time range according to the dimming range variable stored in the variable storage; a pulse width modulation generator generating a pulse width modulation signal according to the randomly determined brightness so that the brightness gradually increases in a rising section of a lighting-on interval and reaches the brightness determined by the light emission random determiner at the end of the rising section, and the brightness gradually decreases in a falling section of the lighting-on interval and fades away at the end of the falling section; and a light emitting diode driver driving the light emitting diode with the pulse width modulation signal generated by the pulse width modulation generator according to the lighting-on interval of the flickering cycle randomly determined.

The control unit may further include a variable setter setting variables to be stored in the variable storage according to a user input.

The plurality of light-emitting units may be divided into two or more groups; and the variable setter may set variables differently on a per group basis according to the user input.

Advantageous Effects

The disclosed random lighting device allows the light-emitting units to randomly emit light by themselves, while also permitting a special atmosphere to be created by limiting the flickering cycle and brightness constantly. Further, dimming is performed at the rising time when the light-emitting unit is turned on and at the falling time when the light-emitting unit is turned off while limiting the rising time and the falling time, thereby creating the atmosphere more variously. In addition, since the user can directly set variables such as flickering cycle and brightness, it is possible to create an atmosphere intended by the user.

MODE FOR INVENTION

The foregoing and further aspects of the present invention will become more apparent from the following detailed description of preferred embodiments with reference to the accompanying drawings. Hereinafter, embodiments of the present invention will be described in detail with reference to the accompanying drawings.

Figure 1:
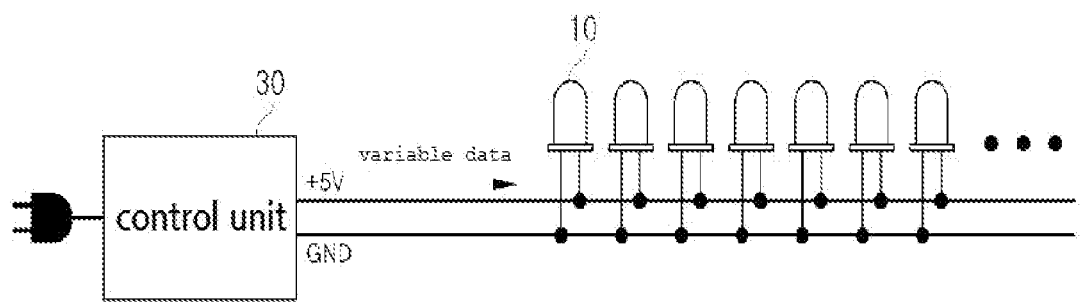
FIG. 1 is a view showing a random lighting device according to an embodiment.

FIG. 1 is a view showing a random lighting device according to an embodiment. As shown in FIG. 1, the random lighting device includes a plurality of light-emitting units 10 and a control unit 30. The light-emitting units 10 include tens to hundreds light-emitting units, and may be connected in parallel. The light-emitting units may receive operating power from the control unit 30 to be operated. Each light-emitting unit 10 randomly determines flickering cycle and brightness of a light emitting diode (LED) by itself, and the LED is controlled to emit light according to the determined flickering cycle and brightness. That is, the light-emitting units 10 randomly determine the flickering cycle and brightness by themselves, rather than randomly emitting light according to the light emission control command from the outside, so that the LED emits light.

The control unit 30 may limit the range of the flickering cycle and brightness of the light-emitting units 10. That is, the control unit 30 limits the flickering cycle and the brightness, which are randomly determined by the light-emitting units 10, within a predetermined range. The control unit 30 transmits the limiting variables to the light-emitting units 10, and the light-emitting units 10 randomly determine the flickering cycle and brightness of the LEDs, in which the flickering cycle and brightness are determined randomly within the range considering the limiting variables. In addition, the control unit 30 may supply operating power to the light-emitting units 10. According to an embodiment of the present invention, the control unit 30 supplies operating power to the light-emitting units 10 via a power supply line and transmits the same to the light-emitting units 10 via a separate control line. According to another embodiment, the control unit 30 not only supplies operating power to the light-emitting units 10 via the power supply line, but also transmits the limiting variables via the power supply line.

Figure 2:
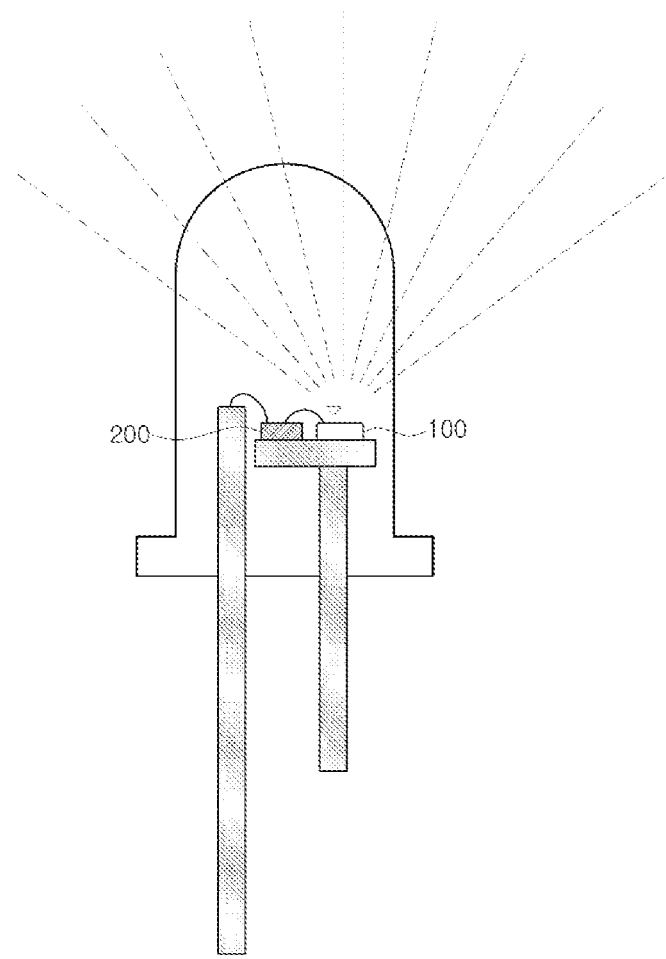
FIG. 2 is a view showing a package structure of a light-emitting unit according to an embodiment.

FIG. 2 is a view showing a package structure of a light-emitting unit according to an embodiment of the present invention. A circuit unit 200 for controlling the light emission of the light emitting diode 100 by randomly determining the flickering cycle and brightness of the light is further provided in addition to the light emitting diode 100 within the existing LED package, so that they are integrated into a single package.

Figure 3:
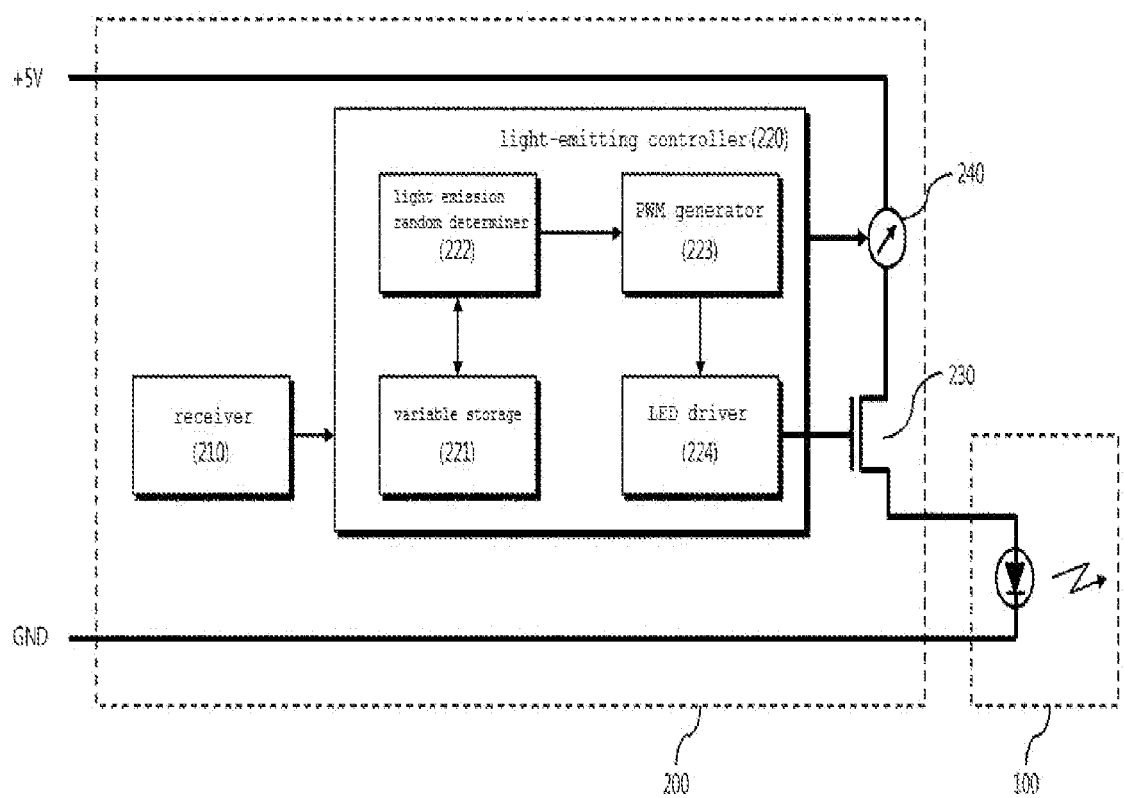
FIG. 3 is a block diagram showing a light-emitting unit according to an embodiment.

FIG. 3 is a block diagram showing a light-emitting unit according to an embodiment of the present invention. As shown in FIG. 3, the circuit unit 200 of the light-emitting unit 10 may include a receiver 210 and a light-emitting controller 220. The receiver 210 receives the limiting variables from the control unit 30. According to an embodiment, the limiting variables include a flickering cycle range variable for limiting the flickering cycle and a brightness range variable for limiting the brightness. The light-emitting controller 220 includes a variable storage 221, a light emission random determiner 222, a pulse width modulation (PWM) generator 223, and an LED driver 224. The variable storage 221 may include one or more registers. The variable storage 221 stores limiting variables received through the receiver 210, for example, a flickering cycle range variable and a brightness range variable. The flickering cycle range variable includes an on time range value and an off time range value for the LED 100, and the brightness range variable indicates a duty ratio range value of a PWM signal.

The light emission random determiner 222 randomly determines the flickering cycle and the brightness of the LED 100. To this end, the light emission random determiner 222 may include a random number generator. The random number generator may generate only one random number, or generate a random number for each of the flickering cycle and the brightness. When the light emission random determiner 222 randomly determines the flickering cycle and the brightness with a random number generated by the random number generator, the flickering cycle and the brightness are randomly determined within the flickering cycle range and brightness range limited according to the flickering cycle range variable and the brightness range variable stored in the variable storage 221. In other words, when the light emission random determiner 222 determines the LED on time value and the LED off time value with the random number, the LED On time value and LED off time value are determined within the limited on/off time range according to the on time range value and the off time range value stored in the variable storage 221. In addition, when the light emission random determiner 222 determines a PWM duty ratio for the LED brightness using the random number, the PWM duty ratio is determined within a limited PWM duty ratio range according to the PWM duty ratio range value stored in the variable storage 221.

The PWM generator 223 generates a PWM signal in accordance with the brightness determined by the light emission random determiner 222, that is, the PWM duty ratio. When the LED driver 224 drives the LED 100 with the PWM signal generated by the PWM generator 223, the LED 100 is driven with the PWM signal in accordance with a lighting-on interval according to the on time range value determined by the light emission random determiner 222. The output of the PWM signal is stopped during a lighting-off interval according to the off time range value. Meanwhile, a reference numeral 230 denotes a field effect transistor (FET), which is controlled to be switched by the LED driver 224. That is, the LED driver 224 may output the PWM signal to the FET 230 to control the switching of the FET 230, thereby driving the LED 100. In addition, a reference numeral 240 denotes a constant current source, which performs control so that the current flowing through the LED 100 is constant.

Meanwhile, the limiting variables received through the receiver 210 and stored in the variable storage 221 may further include a dimming range variable for limiting dimming. The dimming range variable includes a rising time range value and a falling time range value of the LED 100. The rising time range is the first section (rising section), and the falling time range is the last section (falling section), in the lighting-on interval. Dimming is performed in these sections. The PWM generator 223 generates the PWM signal as described above, so that the brightness gradually increases in the rising section and reaches the brightness determined by the light emission random determiner 222 at the end of the rising section, and the brightness gradually decreases in the falling section and fades away at the end of the falling section.

Figure 4:
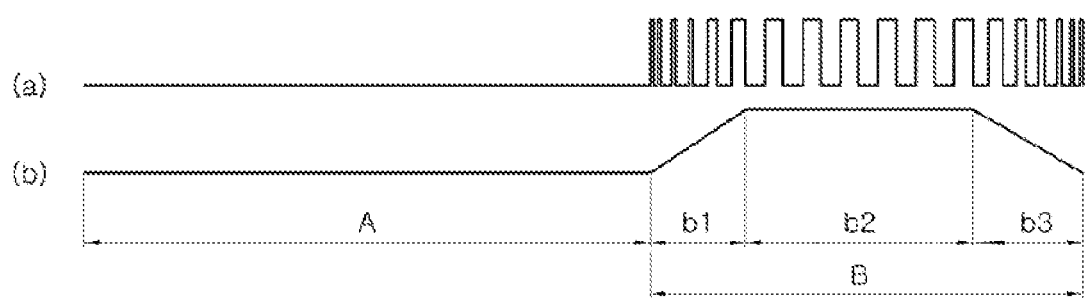
FIG. 4 is a view showing a PWM signal waveform according to an embodiment.

To help understanding thereof, description is made referring to FIG. 4. FIG. 4(a) shows a PWM waveform, and FIG. 4(b) shows a waveform when a PWM waveform passes through a low pass filter (LPF). The actual brightness of the LED 100 is shown in FIG. 4(b). In FIG. 4, a reference symbol A represents a lighting-out interval, and a reference symbol B represents a lighting-on interval by the PWM waveform. The reference symbol B may be further divided into b1, b2 and b3, where b1 represents a rising section, b2 represents a brightness stability section, and b3 represents a falling section. Through the PWM waveform shown in FIG. 4(a), the brightness gradually increases in the rising section, the brightness is kept constant in the brightness stability section, the brightness gradually decreases in the falling section, so that the brightness is maintained constant as shown in FIG. 4(b).

Meanwhile, the lighting-on time, the lighting-off time, the brightness, the rising time range, and the falling time range, which are randomly determined by the light emission random determiner 222, may maintain unchanged in a state where the power is supplied to the light-emitting unit 10. However, when the updated limiting variables are received from the controller 320, the lighting-on time, the lighting-out time, the brightness, the rising time range, and the falling time range may be randomly determined considering the limiting variables. Here, the previous random number value may be used as it is, or a random number may be newly created and used.

Figures 5, 6:
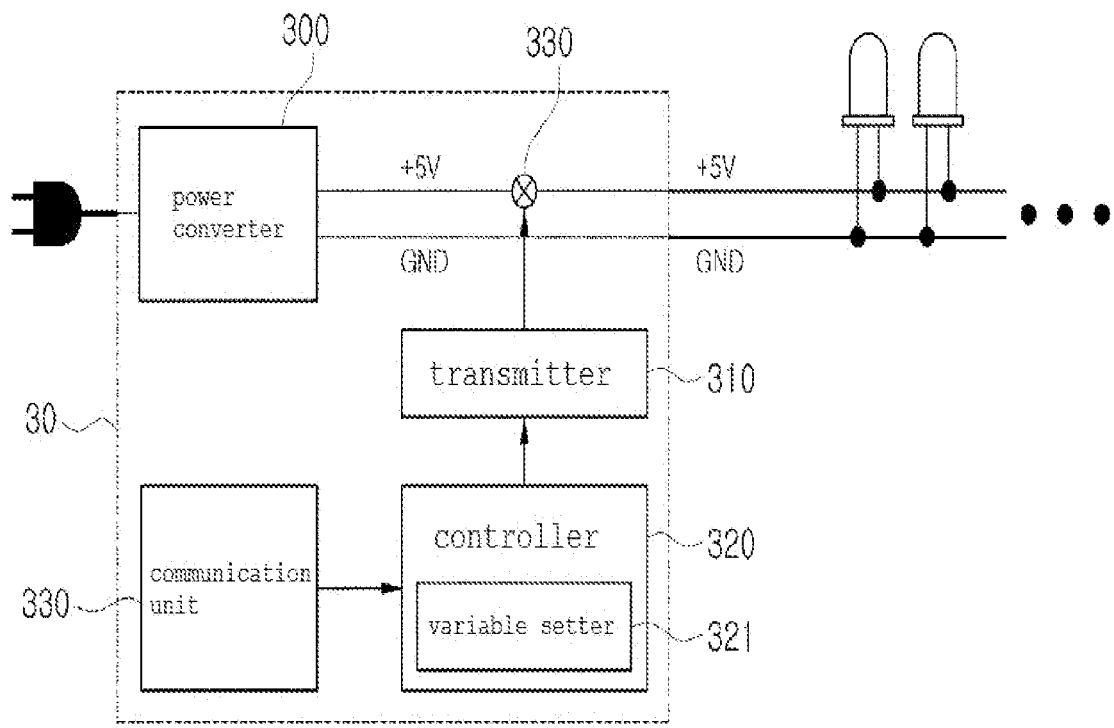
FIG. 5 is a block diagram showing a control unit according to an embodiment.
FIG. 6 is a view showing a table of limiting variables.

FIG. 5 is a block diagram of a control unit according to an embodiment. As shown in FIG. 5, the control unit 30 may include a power converter 300, a transmitter 310, and a controller 320. The control unit 30 may further include a communication unit 330 for receiving data input by a user at an external communication terminal. The communication unit 330 may be a wired communication module or a wireless communication module such as Bluetooth. Also, although not shown, the control unit 30 may include a touch screen or other input means for user input. The power converter 300 may be an AC/DC converter for converting commercial AC power to DC power. The converted DC power is supplied to the light-emitting units 10 which are parallel-connected. The transmitter 310 serves to transmit the limiting variables set by the variable setter 321 to the light-emitting units 10. The limit variable data transmitted by the transmitter 310 may be mixed into the power supply line through a mixer 330, which may be implemented with a simple structure in which the limit variable data is sent with DC power source using a transformer, because the amount of data is not large and high speed is not required.

The controller 320 may be a microcontroller. The controller 320 includes a variable setter 321. The variable setter 321 sets the above-described limiting variable. The limiting variables capable of being set include a flickering cycle range variable and a brightness range variable, and may further include a dimming range variable. Specifically, the variable setter 321 sets an on-time range value and an off-time range value belonging to the flickering cycle range variable, sets a PWM duty ratio range value which is a brightness range variable, and sets a rising time range value and a falling time range value included in the dimming range variable. According to an embodiment, the variable setter 321 automatically selects any one set of sets of variables which are already stored in the internal memory of the control unit 30, or sets the limiting variables selected according to user input. The user input for selecting the set of variables may be made through buttons provided in the control unit 30. For example, the control unit 30 has a plurality of buttons, each button corresponding to a specific set of variables. Thus, the user may select a specific set of variables through the desired button input. Alternatively, the user input for selecting the set of variables is performed in the communication terminal, and the input data may be received through the communication unit 330. In addition, the automatic selection may follow a predetermined schedule. The variable setter 321 may automatically select one set among from a plurality of sets of variables according to a predetermined schedule. For reference, each set of variables includes the flickering cycle range variable and the brightness range variable, and may further include the dimming range variable.

According to another embodiment, the variable setter 321 sets the limit variables to specific values entered by the user. That is, the user may input range values for flickering cycle limitation, brightness limitation, dimming limitation, and the variable setter 321 sets the flickering cycle range variable, the brightness range variable, and the dimming range variable as values inputted from the user. The user input may be performed through a touch screen provided in the control unit 30 or other input means, or may be received from an external communication terminal through the communication unit 330.

The variable setter 321 transmits the set limiting variables to the light-emitting units 10 through the transmitter 310. For reference, FIG. 6 illustrates a limit variable table. Among the variables, D disclosed as a unit of brightness means a duty ratio of the PWM waveform. As described above, when the plurality of LEDs 100 are randomly emitted, it is possible to create a special atmosphere, not simple random flickering by limiting the flickering cycle range and the brightness range. For example, when the flickering cycle is set to 1 to 2 seconds and the lighting-on time is set as short as about 0.05 seconds, it is possible to have a dynamic effect like a wave shining by the sun. On the contrary, when the flickering cycle is set longer than 10 seconds, in which most of the time is set as the lighting-off time and the off time is set to about 0.05 seconds, it may produce a static effect such as stars glittering in the night sky or a candle flickering in the wind. In addition, it is possible to create a variety of atmospheres by limiting the brightness. Further, it is possible to create new atmospheres such as smoke or fog, by limiting the turning-on time and turning-off time and performing dimming during these limited times. Moreover, when the user directly sets the limiting variables, it is possible to create an atmosphere reflecting the intention of the user.

According to a further aspect, a plurality of light-emitting units 10 may be divided into two or more groups, and the variable setter 321 may set the limiting variables differently for each group according to user input. To this end, as shown in FIG. 1, a separate power supply line is provided for each group, so that the control unit 30 may be connected to the light-emitting units 10 for each group. As described above, by setting the limiting variables differently for each group, it is possible to create two or more different atmospheres using a single random illumination device.

The present invention has been described with reference to the preferred embodiments. It will be understood by those skilled in the art that various changes in form and details may be made therein without departing from the spirit and scope of the invention as defined by the appended claims. Therefore, the disclosed embodiments should be considered in an illustrative rather than a restrictive sense. The scope of the present invention is defined by the appended claims rather than by the foregoing description, and all differences within the scope of equivalents thereof should be construed as being included in the present invention.

The invention claimed is:
1. A random lighting device, comprising:
a plurality of light-emitting units, each including a light emitting diode and a light-emitting control unit for randomly determining a flickering cycle and brightness of the light emitting diode to control light emission of the light emitting diode; and
a control unit limiting ranges of the flickering cycle and brightness of the light-emitting units,
wherein the light-emitting control unit includes:

a variable storage storing a flickering cycle range variable and a brightness range variable for limiting the flickering cycle and the brightness received from the control unit, respectively;
a light emission random determiner randomly determining the flickering cycle and the brightness within a flickering cycle range and a brightness range limited according to the flickering cycle range variable and the brightness range variable stored in the variable storage.

2. The device of claim 1, wherein the light-emitting control unit further includes:
a pulse width modulation generator generating a pulse width modulation signal according to the randomly determined brightness; and
a light emitting diode driver driving the light emitting diode with the pulse width modulation signal according to a lighting-on interval of the randomly determined flickering cycle.

3. The device of claim 1, wherein the control unit further includes a variable setter for setting variables to be stored in the variable storage according to a user input.

4. The device of claim 3, wherein the control unit further includes a communication unit for communicating with an external communication terminal; and
the variable setter sets the variables to be stored in the variable storage according to the user input received through the communication unit.

5. The device of claim 3, wherein the plurality of light-emitting units are divided into two or more groups; and
the variable setter sets the variables differently on a per group basis according to the user input.

6. A random lighting device, comprising:
a plurality of light-emitting units, each including a light emitting diode and a light-emitting control unit for randomly determining a flickering cycle and brightness of the light emitting diode to control light emission of the light emitting diode; and
a control unit limiting ranges of the flickering cycle and brightness of the light-emitting units,
wherein the light-emitting control unit includes:
a variable storage storing a flickering cycle range variable and a brightness range variable for limiting the flickering cycle and the brightness received from the control unit, respectively, and a dimming range variable for limiting dimming;
a light emission random determiner randomly determining the flickering cycle within a flickering cycle range limited according to the flickering cycle range variable stored in the variable storage and randomly determining the brightness within a brightness range limited according to the brightness range variable stored in the variable storage, and randomly determining a rising time and a falling time within a rising time range and a falling time range according to the dimming range variable stored in the variable storage.

7. The device of claim 1, wherein the control unit further includes:
a variable setter setting variables to be stored in the variable storage as a set of variables selected by a user or a set of variables automatically selected according to a predetermined schedule among a plurality of sets of variables that are pre-stored.

8. The device of claim 7, wherein the plurality of light-emitting units are divided into two or more groups; and
the variable setter sets the variables differently on a per group basis according to the user input.

9. The device of claim 6,
wherein the light-emitting control unit further includes:
a pulse width modulation generator generating a pulse width modulation signal according to the randomly determined brightness so that the brightness gradually increases in a rising section of a lighting-on interval and reaches the brightness determined by the light emission random determiner at an end of the rising section, and the brightness gradually decreases in a falling section of the lighting-on interval and fades away at an end of the falling section; and
a light emitting diode driver driving the light emitting diode with the pulse width modulation signal generated by the pulse width modulation generator according to the lighting-on interval of the flickering cycle randomly determined.

* * * * *